(12) United States Patent
 Afzali-Ardakani et al.

(10) Patent No.: US 10,783,334 B2
(45) Date of Patent: *Sep. 22, 2020

(54) EMBEDDED SENSOR CHIPS IN POLYMER-BASED COATINGS

(71) Applicant: International Business Machines Corporation, Armonk, NY (US)

(72) Inventors: Ali Afzali-Ardakani, Ossining, NY (US); Homa Alemzadeh, Crozet, VA (US); Maryam Ashoori, White Plains, NY (US); Bahman Hekmatshoartabari, White Plains, NY (US); Elham Khabiri, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 377 days.

This patent is subject to a terminal disclaimer.

(21) Appl. No.: 15/842,552

(22) Filed: Dec. 14, 2017

(65) Prior Publication Data
US 2018/0300514 A1 Oct. 18, 2018

Related U.S. Application Data

(63) Continuation of application No. 15/487,187, filed on Apr. 13, 2017, now Pat. No. 10,387,694.

(51) Int. Cl.
*G06F 11/30* (2006.01)
*G06K 7/10* (2006.01)
(Continued)

(52) U.S. Cl.
CPC ......... *G06K 7/10198* (2013.01); *G01D 18/00* (2013.01); *G01D 21/00* (2013.01);
(Continued)

(58) Field of Classification Search
CPC .................................................. G06K 7/10198
See application file for complete search history.

(56) References Cited

U.S. PATENT DOCUMENTS

| 7,214,500 B2* | 5/2007 | Kataoka | C08G 65/329 424/78.31 |
|---|---|---|---|
| 10,387,694 B2* | 8/2019 | Afzali-Ardakani | G01D 18/00 |
| 2016/0034663 A1 | 2/2016 | Nino et al. | |
| 2016/0324442 A1* | 11/2016 | Zdeblick | A61B 5/0537 |

FOREIGN PATENT DOCUMENTS

EP 3077933 A1 10/2016

OTHER PUBLICATIONS

Office Action dated Nov. 15, 2018 for U.S. Appl. No. 15/487,187, 23 pages.
(Continued)

*Primary Examiner* — Phuong Huynh
(74) *Attorney, Agent, or Firm* — Amin, Turocy & Watson, LLP

(57) ABSTRACT

Systems, methods, and electronic circuits facilitating embedded sensor chips in polymer-based coatings are provided. In one example, a method comprises fabricating an electronic circuit, the electronic circuit comprising one or more semiconductor devices, one or more sensors, and a communication element; encapsulating the electronic circuit within an insulator, resulting in an encapsulated circuit; and dispersing the encapsulated circuit into a lacquer solution comprising a polymer carrier and a solvent.

9 Claims, 12 Drawing Sheets

(51) Int. Cl.
  *H01L 23/29* (2006.01)
  *H01L 21/56* (2006.01)
  *G01D 18/00* (2006.01)
  *G06N 20/00* (2019.01)
  *G01D 21/00* (2006.01)
  *H01L 21/683* (2006.01)
  *H01L 23/31* (2006.01)
  *G06N 3/04* (2006.01)

(52) U.S. Cl.
  CPC ..... *G06K 7/10316* (2013.01); *G06K 7/10465* (2013.01); *G06N 20/00* (2019.01); *H01L 21/56* (2013.01); *H01L 21/6835* (2013.01); *H01L 23/293* (2013.01); *H01L 23/3135* (2013.01); *G06N 3/0445* (2013.01); *G06N 3/0454* (2013.01); *H01L 21/561* (2013.01); *H01L 21/568* (2013.01); *H01L 2221/68354* (2013.01); *H01L 2221/68368* (2013.01)

(56) References Cited

OTHER PUBLICATIONS

List of IBM Patents and Applications to be treated as related.
Mell et al., "The NIST Definition of Cloud Computing," NIST Special Publication 800-145, Sep. 2011, National Institute of Standards and Technology, U.S. Department of Commerce, 7 pages.
"Hitachi Develops a New RFID with Embedded Antenna μ-Chip" http://www.hitachi.com/New/cnews/030902.html Last accessed Apr. 13, 2017, 3 pages.
"Recurrent neural network" https://en.wikipedia.org/wiki/Recurrent_neural_network Last accessed Apr. 13, 2017, 11 pages.
"Convolutional neural network" https://en.wikipedia.org/wiki/Convolutional_neural_network Last accessed Apr. 13, 2017, 17 pages.
U.S. Appl. No. 15/487,187, filed Apr. 13, 2017.

* cited by examiner

EMBEDDED SENSOR CHIPS IN POLYMER-BASED COATINGS

BACKGROUND

The subject disclosure relates to semiconductor devices, and more specifically, to application of embedded sensors within semiconductor chips.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatus and/or computer program products that facilitate synchronization of processing components for parallel deep learning are described.

According to an embodiment, a method can include fabricating an electronic circuit, the electronic circuit including one or more semiconductor devices, one or more sensors, and a communication element, encapsulating the electronic circuit within an insulator, resulting in an encapsulated circuit, and dispersing the encapsulated circuit into a lacquer solution that includes a polymer carrier and a solvent.

According to another embodiment, a system can include an electronic circuit encapsulated within an insulator, the electronic circuit including one or more semiconductor devices, one or more sensors and a communication element, and a lacquer solution into which the encapsulated electronic circuit is dispersed, the lacquer solution including a polymer carrier and a solvent.

According to yet another embodiment, an electronic circuit can include one or more sensors, a communication element operatively coupled to the one or more sensors, and an insulator substantially encapsulating the electronic circuit, where the electronic circuit is dispersed into a polymer-based solution that includes a polymer carrier and a solvent.

DETAILED DESCRIPTION

Figure 1:
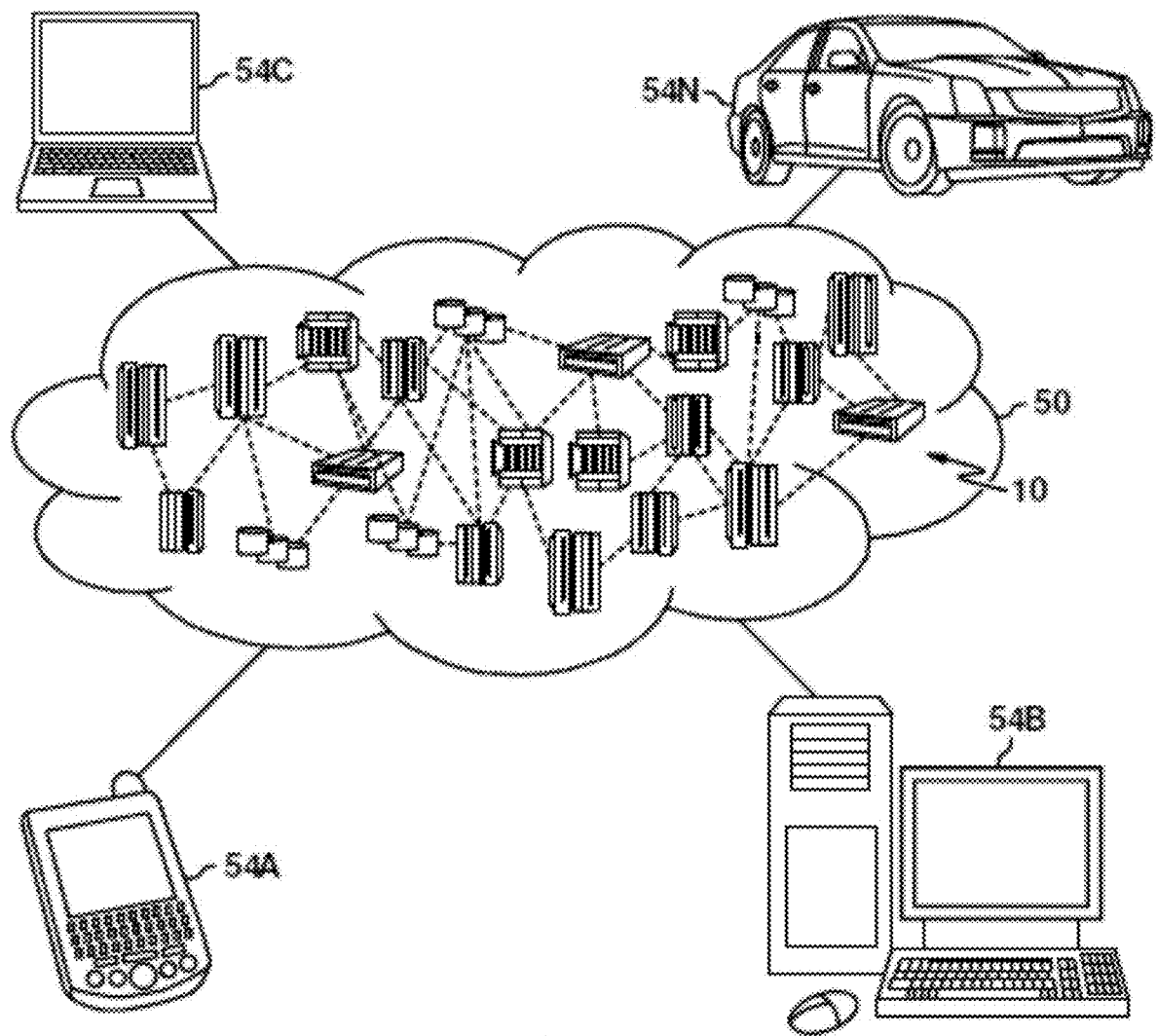
FIG. 1 is a diagram depicting a cloud computing environment according to one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 1, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
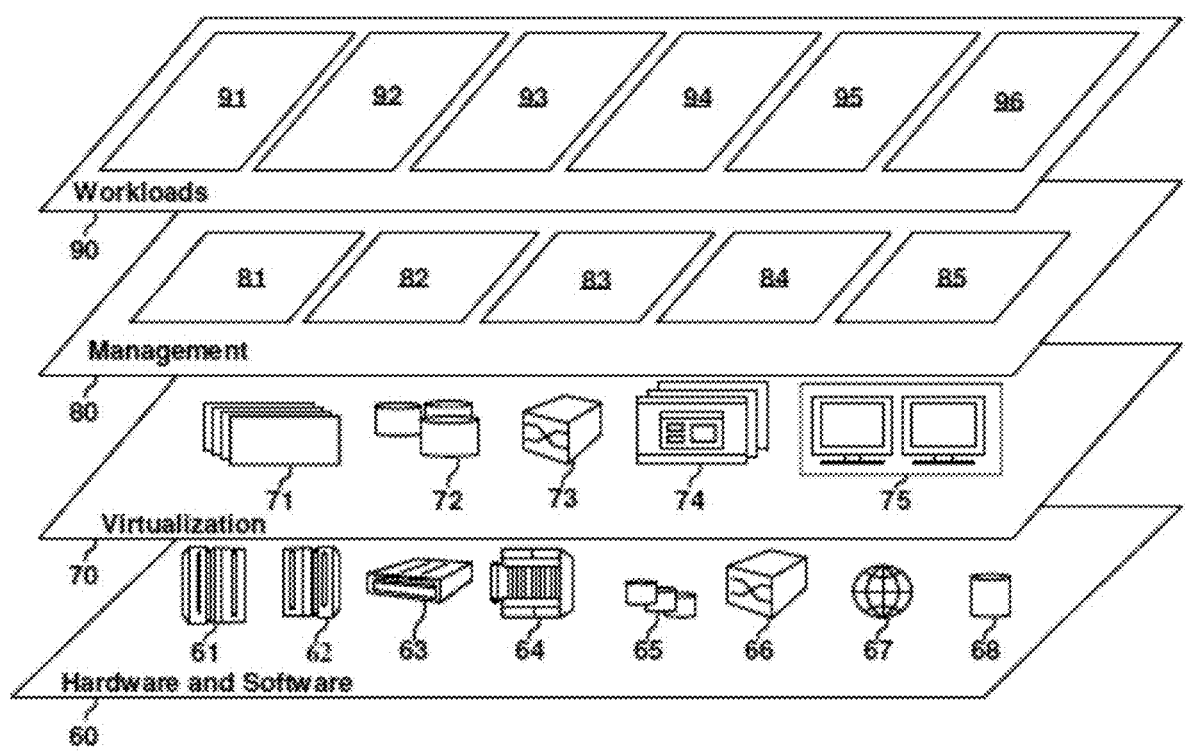
FIG. 2 is a diagram depicting abstraction model layers according to one or more embodiments described herein.

Referring now to FIG. 2, a set of functional abstraction layers provided by cloud computing environment 50 (FIG. 1) is shown. It should be understood in advance that the components, layers, and functions shown in FIG. 2 are intended to be illustrative only and one or more embodiments of the invention are not so limited. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and sensor data management 96.

Disclosed herein are techniques for embedding sensor chips and communication elements, e.g., radio frequency identification (RFID) antennas, in a polymer-based solution such as nail lacquer or nail polish. Additionally disclosed herein are techniques for utilizing electronic circuits dispersed in nail lacquer in detecting environmental conditions associated with a person or an area near a person. For instance, systems and methods described herein can be used for, e.g., monitoring disease progression in patients with Parkinson's disease, detecting carbon monoxide levels in an area, etc. These and other systems, methods, and electronic circuits are described in further detail below.

An example application of sensor-integrated nail polish is detection and/or monitoring of tremor associated with Parkinson's disease. Parkinson's disease affects a significant portion of the population of the United States and globally. The combined direct and indirect costs of the disease, from sources such as treatment, and lost income from inability to work, can be substantial both for an individual patient and society at large.

Parkinson's disease is a progressive condition, in that symptoms can worsen and new symptoms can appear over time. It is difficult to estimate how quickly or slowly Parkinson's will progress in an individual person. Systems, method, and circuits described herein provide for continuous monitoring of Parkinson's patients through embedded accelerometers on nail polish to monitor severity and/or frequency of tremor in order to obtain a finer understanding of the progression of the disease in the individual patient. In addition to measurement of Parkinson's tremor, the application of accelerometers in wearable nail polish can also be applied to any other hand movements that are desirably performed with a degree of precision. For instance, a nail polish with embedded accelerometers as described herein can be utilized to detect shaky hands during a heart or brain surgery, such that a warning can be provided to a surgeon and/or associated medical personnel if shaky hands are detected during an operation.

Another example application of sensor-integrated nail polish as described herein is the detection of carbon monoxide (CO). CO is a colorless, odorless, harmful gas that poses a high risk of serious injury at high concentrations. While CO can be released during fires, accidental non-fire related CO inhalation poses a particular risk due to the difficulty in properly detecting potentially toxic CO levels. Systems, methods, and circuits described herein can mitigate the danger of CO inhalation harm by utilizing CO sensors adhered in a nail polish as a safe way to monitor CO levels.

Figure 3:
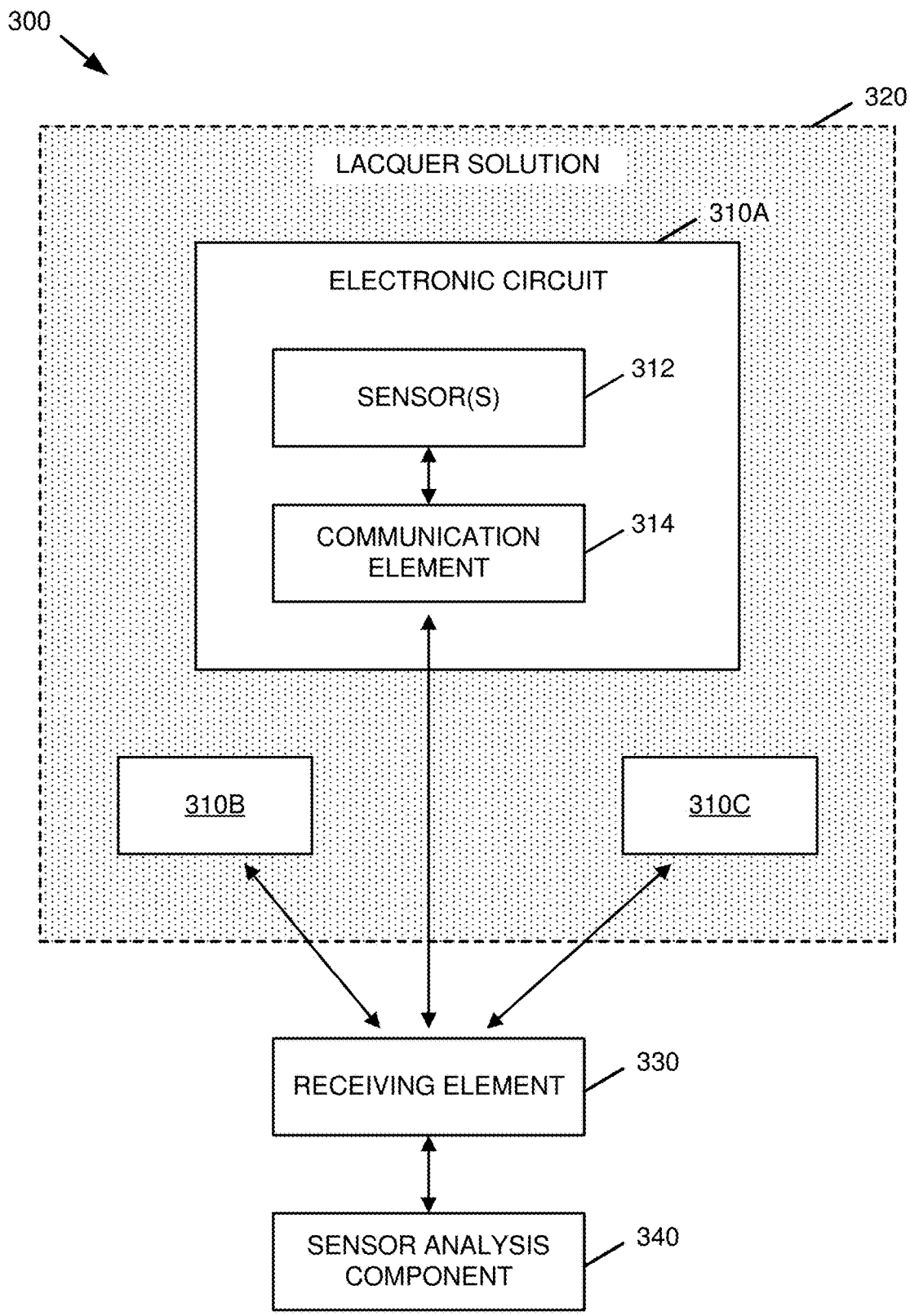
FIG. 3 is a block diagram of an example, non-limiting system that facilitates measuring and obtaining sensor data from electronic circuits suspended in a solution according to one or more embodiments described herein.

Turning now to FIG. 3, a block diagram of a system 300 that facilitates measuring and obtaining sensor data from electronic circuits suspended in a solution according to one or more embodiments described herein is provided. Repetitive description of like elements employed in other embodiments described herein is omitted for sake of brevity.

The system 300 includes one or more electronic circuits 310, here three electronic circuits 310A-C, that are dispersed within a polymer-based lacquer solution 320 (e.g., nail lacquer). The electronic circuits 310 can have one or more sensors 312 (e.g., accelerometers, CO sensors, etc.) and a communication element 314. For simplicity of illustration, the sensor(s) 312 and communication element 314 are illustrated with respect to only electronic circuit 310A. However, it should be appreciated that electronic circuits 310B and/or 310C could include similar components.

In an aspect, the sensor(s) 312 and/or communication element 314 can be, or form part of, one or more semiconductor devices that are embedded and/or otherwise integrated into the electronic circuits 310. In some embodiments other semiconductor devices could also be implemented into the electronic circuits 310. In still other embodiments, the sensor(s) 312 and/or communication element 314 could be implemented separately from respective semiconductor devices.

In one example, the communication element can be a hardware and/or software component configured to transmit data associated with the sensor(s) 312 and/or other components of the associated electronic circuit 310 to one or more outside devices. The communication element 314 can be configured to communicate according to one or more wireless communication technologies, which can include but is not limited to radio frequency identification (RFID), infrared, etc. Further, the communication element 314 can communicate according to one or more communication protocols, such as Bluetooth, Wi-Fi, one or more cellular communication protocols, and/or any other suitable protocol(s) either presently existing or developed in the future.

While only one communication element 314 is shown in electronic circuit 310A, respective electronic circuits 310 can include any number of communication elements 314. Additionally, the communication element 314 may itself include an antenna and/or be otherwise connected to a distinct antenna via wired and/or wireless communication. For an implementation in which the communication element 314 is separate from an associated antenna, the antenna could also be separate from the associated electronic circuit 310.

As further shown in FIG. 3, the electronic circuits 310 of system 300 can be dispersed within a polymer-based lacquer solution 320. In an aspect, the electronic circuits 310 can be encapsulated with an insulator (not shown) to protect the electronic circuits 310 from exposure to the lacquer solution 320 as well as to establish uniformity in the distribution of the electronic circuits 310 within the lacquer solution 320. In some cases, an insulator may be used to encapsulate an electronic circuit 310 and one or more additional structures. For instance, if a communication element 314 utilizes an antenna that is separate from the associated electronic circuit 310, the insulator can encapsulate both the electronic circuit 310 and the antenna into a single encapsulated unit or multiple units.

In an aspect, the lacquer solution 320 is a polymer-based solution that can be at least partially composed of a polymer carrier and a solvent. The solvent can be and/or include an aqueous solvent and/or an organic solvent. Specific non-limiting examples of solvents and solution compositions that can be used for the lacquer solution 320 are described in further detail below.

As additionally shown by FIG. 3, sensor measurements and/or other data transmitted by the communication elements 314 of respective electronic circuits 310 can be received by a receiving element 330, e.g., a receiver associated with a computing device that includes one or more processors (not shown). The receiving element 330 can, in turn, provide received data to a sensor analysis component 340 that analyzes the received data to monitor a condition associated with an environment in which the electronic circuits 310 are located. An environment associated with electronic circuits 310 can include, but is not limited to, a person (e.g., in the case of a nail lacquer being used as the lacquer solution 320), an environment surrounding a person and/or another object to which the lacquer solution 320 is applied, etc.

Figure 12:
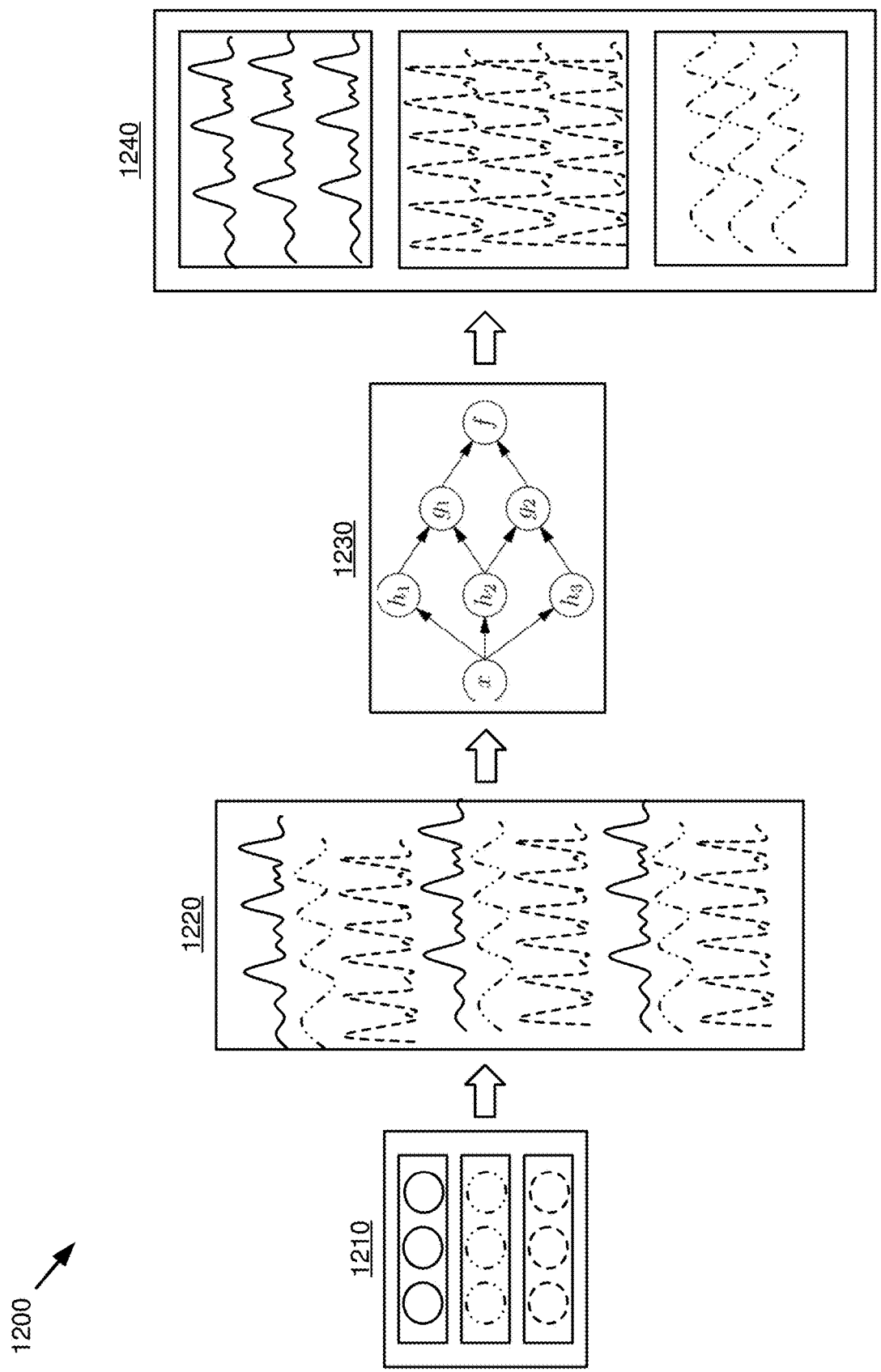
FIG. 12 is a diagram depicting respective stages of an example, non-limiting technique for collecting and classifying sensor data according to one or more embodiments described herein.

In an aspect, the sensor analysis component 340 can receive data signals associated with multiple sensors 312 of multiple sensor types via the receiving element 330. The sensor analysis component 340 subsequently classify the received signals according to their respective originating sensors 312 based on a machine learning algorithm and/or other means. Also or alternatively, the sensor analysis component 340 can employ machine learning or the like to distinguish properly received or genuine signal data from noise and/or faulty signal data. Various techniques by which signal classification can be performed by the sensor analysis component 340 are described in further detail below with respect to FIG. 12.

In various embodiments, the sensor analysis component 340 can be or include hardware, software (e.g., a set of threads, a set of processes, software in execution, etc.) or a combination of hardware and software that performs a computing task (e.g., a computing task associated with received data). For example, the sensor analysis component 340 can execute signal verification and/or classification operations that cannot be performed by a human (e.g., are greater than the capability of a human mind). For example, the amount of data processed, the speed of processing of the data and/or the data types processed by the sensor analysis component 340 over a certain period of time can be respectively greater, faster and different than the amount, speed and data type that can be processed by a single human mind over the same period of time. For example, data processed by the sensor analysis component 340 can be raw data (e.g., raw textual data, raw numerical data, etc.) and/or compressed data (e.g., compressed textual data, compressed numerical data, etc.) associated with one or more computing devices. Moreover, the sensor analysis component 340 can be fully operational towards performing one or more other functions (e.g., fully powered on, fully executed, etc.) while also processing the above-referenced data.

Additionally, the receiving element 330 and the sensor analysis component 340 can be implemented via a single computing device including a processor or distributed across multiple devices. For instance, the receiving element 330 can be associated with a first device, and the sensor analysis component 340 can be associated with the first device and/or a second device. Moreover, the functionality of the sensor analysis component 340 can in some embodiments be distributed across multiple devices, e.g., in a computing cluster or other distributed computing environment.

Turning next to FIGS. 4-10, respective stages of an example technique for fabricating an encapsulated electronic circuit, e.g., an electronic circuit 310, are shown. It should be appreciated, however, that the technique shown in FIGS. 4-10 is merely one way of fabricating an electronic circuit in accordance with various embodiments described herein and that other techniques are also possible. Repetitive description of like elements employed in other embodiments described herein is omitted for sake of brevity.

Figure 4:
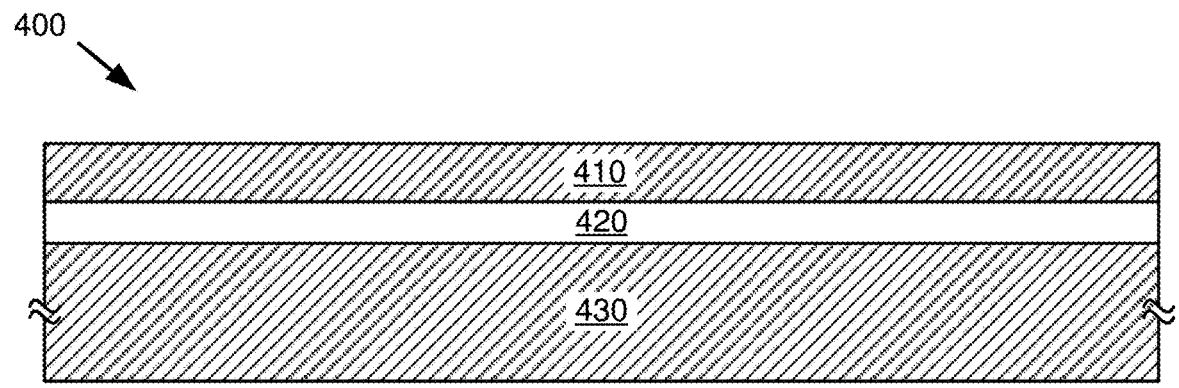
FIGS. 4-10 are diagrams depicting respective steps of an example, non-limiting process of fabricating a polymer-coated sensor chip according to one or more embodiments described herein.

With reference first to FIG. 4, diagram 400 illustrates an example of a starting substrate that can be used to fabricate an encapsulated electronic circuit. Here, the substrate is a silicon-on-insulator (SOI) substrate having a SOI layer 410, a buried oxide layer 420 and/or other buried insulator layer, and a silicon carrier substrate layer 430. Other substrates could also be used.

Figure 5:
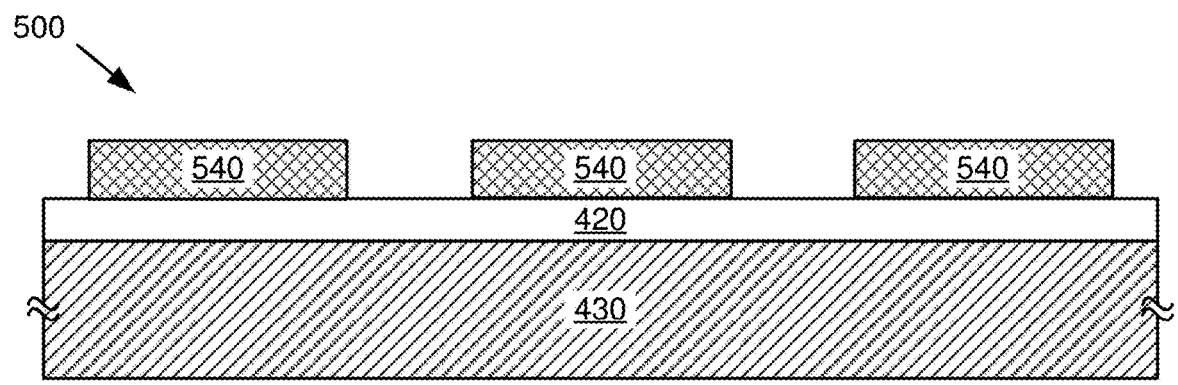

As shown by diagram 500 in FIG. 5, devices, electronic circuits 540, or the like can be fabricated from the SOI layer 410 using one or more semiconductor fabrication technologies generally known in the art. The devices and/or circuits 540 can include active RFID chips and/or other communication elements 314. Also or alternatively, the devices and/or circuits 540 can include energy harvesting devices such as solar cells or RF coils, batteries, wireless transmission devices such as antennas or passive/chipless RFID tags, memory, sensors 412 including photodetectors, resonators, chemical and/or health monitoring devices, accelerometers, active or passive semiconductor devices such as transistors or capacitors, etc.

Figure 6:
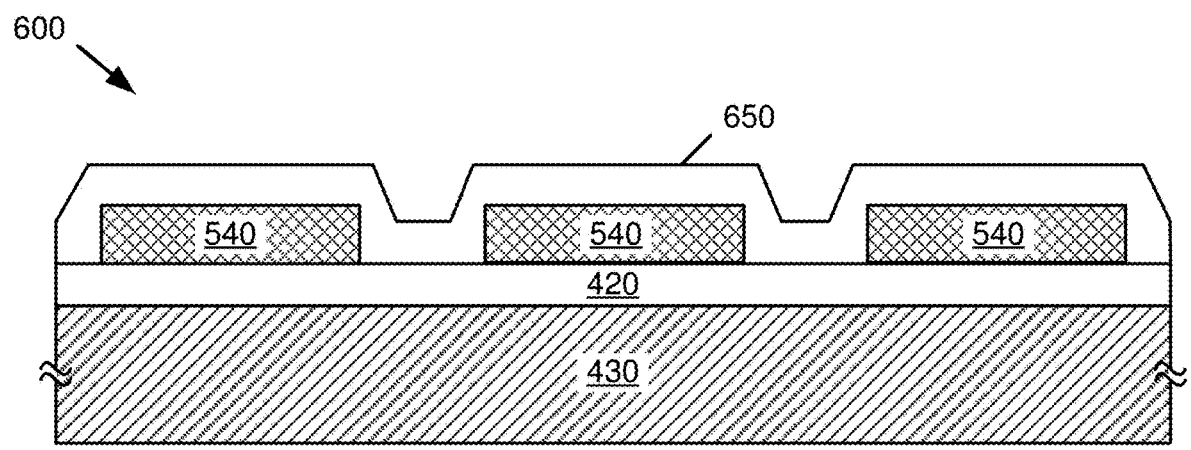

Next, as shown by diagram 600 in FIG. 6, the devices and/or circuits 540 are capped with an insulator layer 650 such as an oxide. In an aspect, pre-programming (e.g., of memory devices) can be performed before the capping. In the event that metal wiring passing between the units is used, e.g., for device programming or testing and/or other purposes, the metal wiring can be etched away at this stage using lithography.

Figure 7:
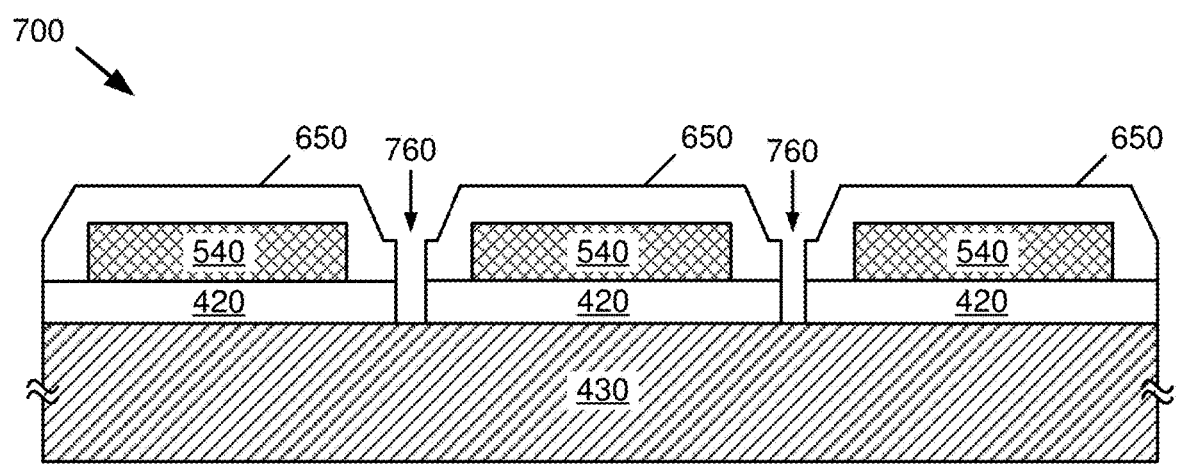

An isolation etch can then be performed through the insulator layer 650 and the buried oxide layer 420 down to the carrier substrate layer 430, as shown by diagram 700 in FIG. 7. As further shown by diagram 700, the isolation etch results in individual encapsulated electronic circuits situated upon the carrier substrate layer 430, each separated by respective gaps 760.

Figure 8:
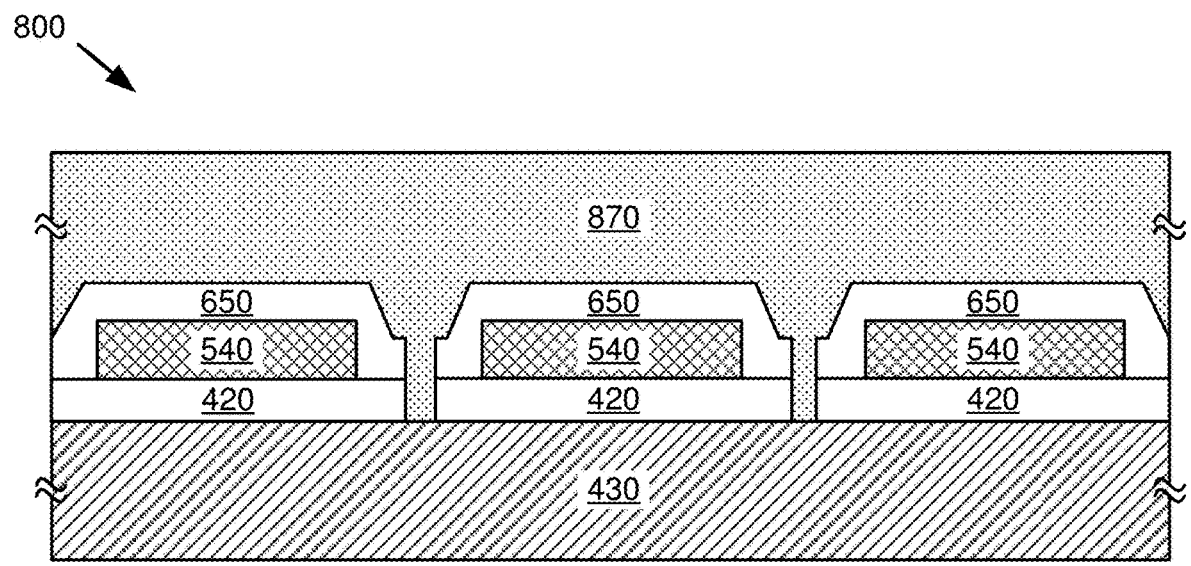

As shown by diagram 800 in FIG. 8, the structure is then attached to a handle/support substrate 870. In one example, the handle/support substrate 870 can be composed at least in part by a spin-on water-soluble material such as polyvinyl alcohol. In another example, the handle/support substrate 870 can include a spin-on resist that is soluble in organic solvents. In yet another example, the handle/support substrate 870 can include a cleave layer (e.g., sputtered amorphous zinc-oxide, etc.), a stressor layer (e.g., sputtered nickel, etc.) and a flexible support substrate attached thereon using an adhesive, which is subsequently used to remove the flexible support substrate by cleaving through the cleave layer.

Figure 9:
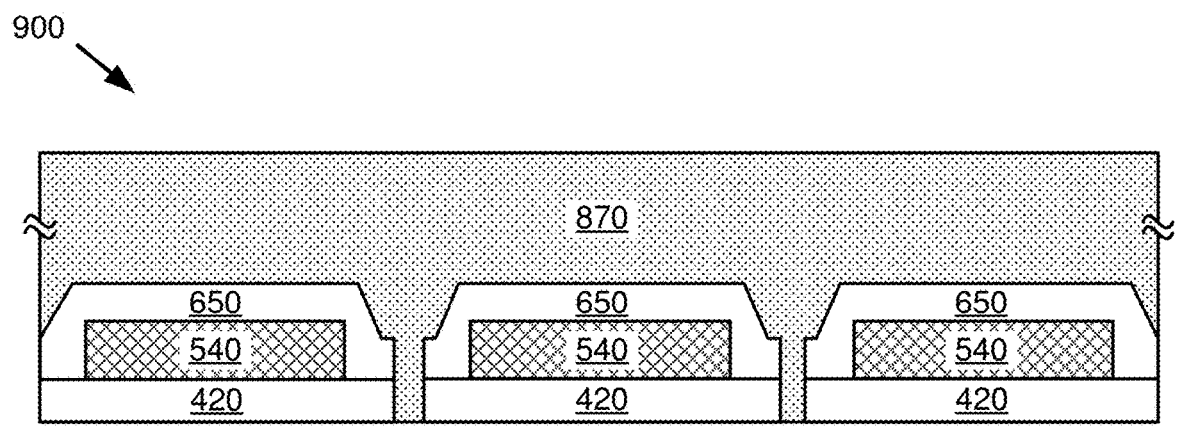

Next, as shown by diagram 900 in FIG. 9, the carrier substrate layer 430 can be removed by, e.g., mechanical grinding, chemical wet and/or dry etching, or a combination of these and/or other techniques. In one example, the carrier substrate layer 430 can also be removed by controlled spalling through the carrier substrate layer 430 close to the buried oxide layer 420, followed by chemical etching.

Figure 10:
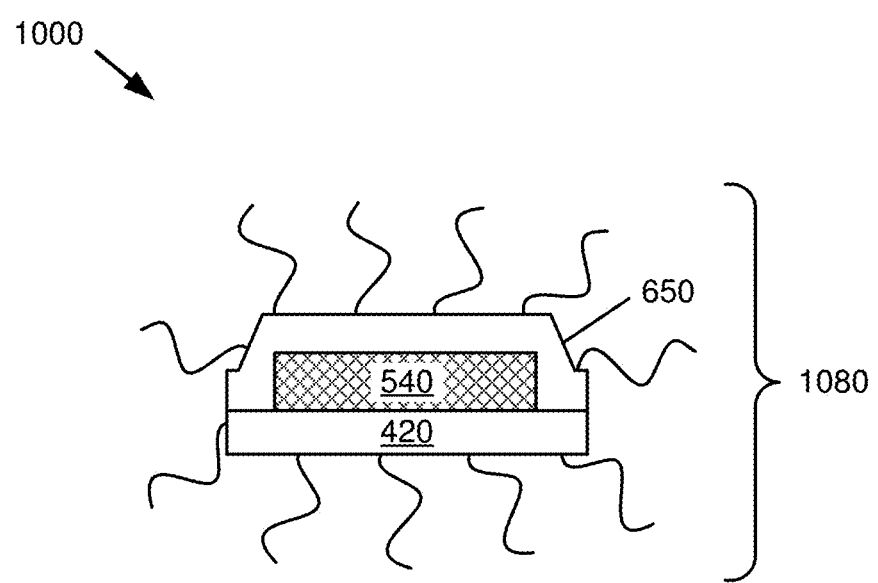

As then shown by diagram 1000 in FIG. 10, the handle/support substrate 870 can be dissolved or detached in a wet solution 1080 (e.g., the lacquer solution 320), thereby releasing the encapsulated electronic circuits into the wet solution 1080. The encapsulated circuits released into the wet solution 1080 can be functionalized before, during or after being released into the wet solution 1080.

In an aspect, sensor chips fabricated as shown by FIGS. 4-10 can be incorporated into a lacquer solution 320, e.g., nail lacquer and/or another polymer-based solution, by dispersion of the chips in a polymer carrier in a solution having an organic solvent.

For organic solvent dispersion, the chips can first be coated with a monolayer of alkylsilanes by immersing the chips in a dilute (e.g., approximately 0.1-1 percent concentration) solution of alkyl trimethoxysilane and then rinsing with the organic solvent (e.g., ethanol, water, a mixture of ethanol and water, etc.). In this process, the surface of the chip can be coated with a monolayer of long chain (e.g., 2-16 carbon atoms) alkyl group molecules, which can aid in dispersing the chips in the carrier and preventing agglomeration of the chips.

Next, the coated chips can be added to a solution of a polymer such as nitrocellulose (e.g., approximately 2-10 percent by solid) in ethyl or butyl acetate and stirred or sonicated to form substantially uniform dispersion. In some embodiments, pigments and/or plasticizers, such as diethyl phtalate, can additionally be added to the mixture. In an aspect, the solution can be constructed such that application of the resulting solution on a surface (e.g., a human nail) results in a thin film (e.g., approximately 1-25 µm) of the composite carrying sensor chips.

For aqueous dispersion, the chips can initially be coated with polyethylene oxide end-capped with trialkoxysilane to form a hydrophilic monolayer on the chips. The coated chips can then be dispersed in an aqueous solution comprising a mixture of polyvinylpyrrolidone and polyethylene oxide diacrylate. In an aspect, this process results in a composite water-based lacquer that, when applied to a human nail and/or another surface, can form a thin film of the chip-containing lacquer, which after drying and exposure to light can form a sparingly soluble film.

Figure 11:
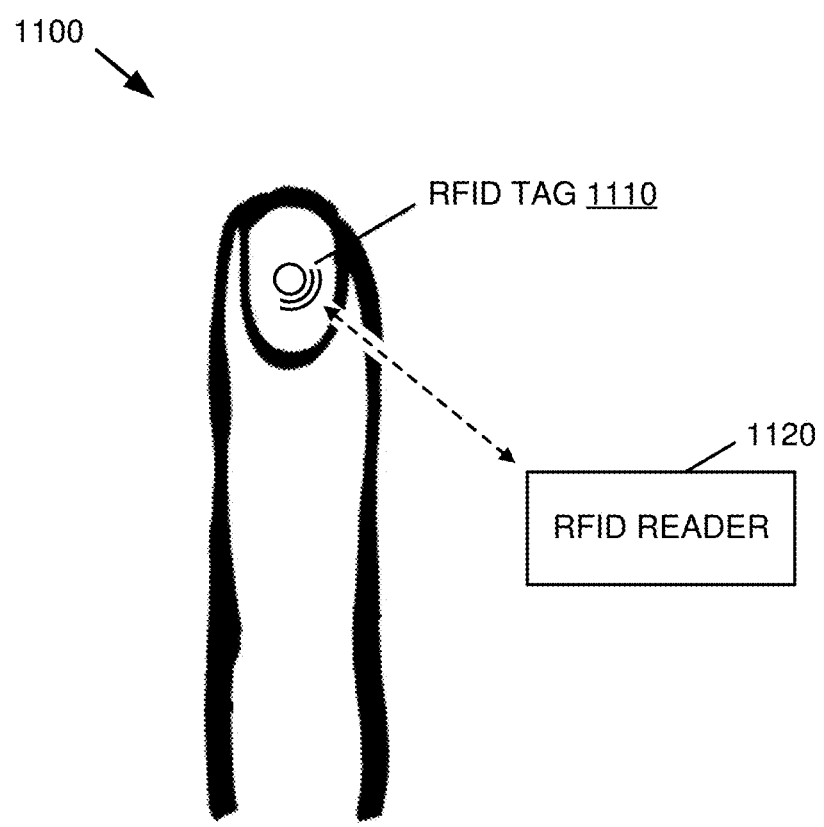
FIG. 11 is a diagram depicting an example, non-limiting communication between a radio frequency identification device (RFID) tag integrated into a nail polish solution and an RFID reader according to one or more embodiments described herein.

With reference next to FIG. 11, diagram 1100 depicts an example interaction between an RFID tag 1110 and an RFID reader 1120 according to one or more embodiments described herein. In an aspect, the RFID tag 1110 can be implemented as a communication element 314 for an encapsulated electronic circuit 310 distributed in a nail polish solution. While the RFID tag 1110 is enlarged in FIG. 11 for purposes of illustration, the overall size of the electronic circuit that includes the RFID tag 1110 can be approximately 100 nm-5 mm in some implementations. As shown in FIG. 11, the RFID tag 1110, independently or via an associated RFID antenna, can transfer sensor data associated with the circuit to a nearby RFID reader 1120, e.g., an RFID reader 1120 associated with a device that includes a sensor analysis component 340.

In an aspect, multiple sensor chips can be embedded into a single electronic circuit 310. Further, an electronic circuit 310 can contain sensors 312 of multiple types, such as, for example, ultraviolet sensors, CO sensors, PH sensors (e.g., for detecting dangerous detergents, etc.), tremor sensors, etc. In another aspect, multiple electronic circuits having different circuit configurations/components and/or different sensor types are separately fabricated and encapsulated, and then dispersed into the same lacquer solution, using the methods described above. In both aspects, the sensor analysis component 340 can be utilized to verify and classify signals corresponding to various types of sensors, as shown by diagram 1200 in FIG. 12.

Diagram 1200 illustrates various sensors of different types (denoted by respective line styles) at 1210. The respective sensors provide corresponding output signals, as shown by 1220. In response to receiving these signals, the sensor analysis component 340 can employ a neural network and/or other machine learning technique to classify the incoming signals, as shown by 1230. The result of this classification is a set of received signals classified by sensor type, as shown by 1240.

In an aspect, the sensor analysis component 340 can utilize recurrent neural networks and/or any other suitable machine learning method to match a received signal with its corresponding sensor type. Such methods can analyze various features (e.g., amplitude, frequency, local or relative peaks/valleys, etc.) of the received signals to determine the sensor types that were most likely to have generated the respective signals. In one example, signals detected by the receiving element 330 and/or analyzed by the sensor analysis component 340, and/or their respective features, can be provided to and/or stored by a cloud computing service for further analytics. Accordingly, such detected signals may be sent to the workloads layer 90 of the cloud computer environment depicted in FIG. 2, whereby, among other things, the detected signals can be recorded and further analyzed by the data sensor management 96 and/or the data analytics processing 94 workloads.

In another aspect, the sensor analysis component 340 can also use machine learning to identify if a given received signal is reliable (e.g., if the signal contains genuine sensor data or faulty sensor data). For instance, a convolutional neural network and/or another suitable technique can be used to train the sensor analysis component 340 for expected sensor signal features in order to improve the ability of the sensor analysis component 340 to identify faulty sensor data. A recurrent neural network can in some cases also or alternatively be used for this purpose, e.g., for repeating signal patterns.

Figure 13:
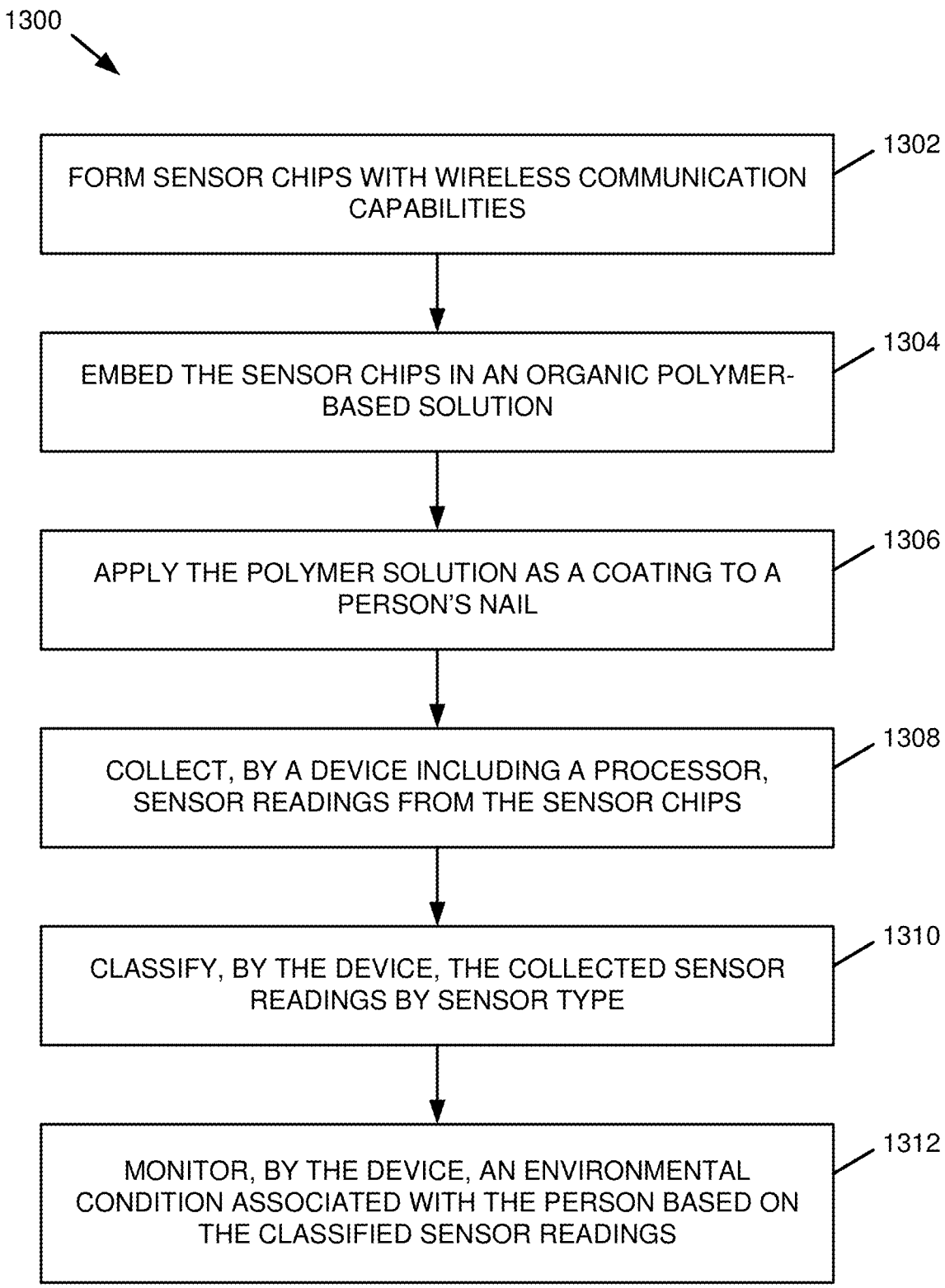
FIG. 13 is a flow diagram of an example, non-limiting method that facilitates monitoring a condition associated with a person via sensor devices suspended within nail lacquer according to one or more embodiments described herein.

FIG. 13 illustrates a flow diagram of an example, non-limiting method 1300 that facilitates monitoring a condition associated with a person via sensor devices suspended within nail lacquer according to one or more embodiments described herein. Repetitive description of like elements employed in other embodiments described herein is omitted for sake of brevity.

At 1302, sensor chips with wireless capabilities, e.g., electronic circuits 310 including sensors 312 and a communication element 314 and encapsulated by an insulator such as insulator layer 650, are formed. At 1304, the sensor chips formed at 1302 are embedded in an organic polymer-based solution, e.g., a lacquer solution 320. At 1306, the polymer solution into which the sensor chips are embedded at 1304 is applied as a coating to a person's nail.

At 1308, a device including a processor collects, e.g., via a receiving element 330, sensor readings from the sensor chips embedded in the solution. At 1310, the device (e.g., via a sensor analysis component 340) classifies the collected sensor readings by sensor type. For example, respective measurements can be received at 1308 from a plurality of sensors 312 associated with the sensor chips via the communication element 314. These measurements can then be classified at 1310 according to their corresponding sensor types, e.g., using a machine learning algorithm based on historical data associated with the plurality of sensor types. At 1312, the device monitors an environmental condition associated with the person to whose nail the solution was applied at 1306 based on the sensor readings classified at 1306.

Figure 14:
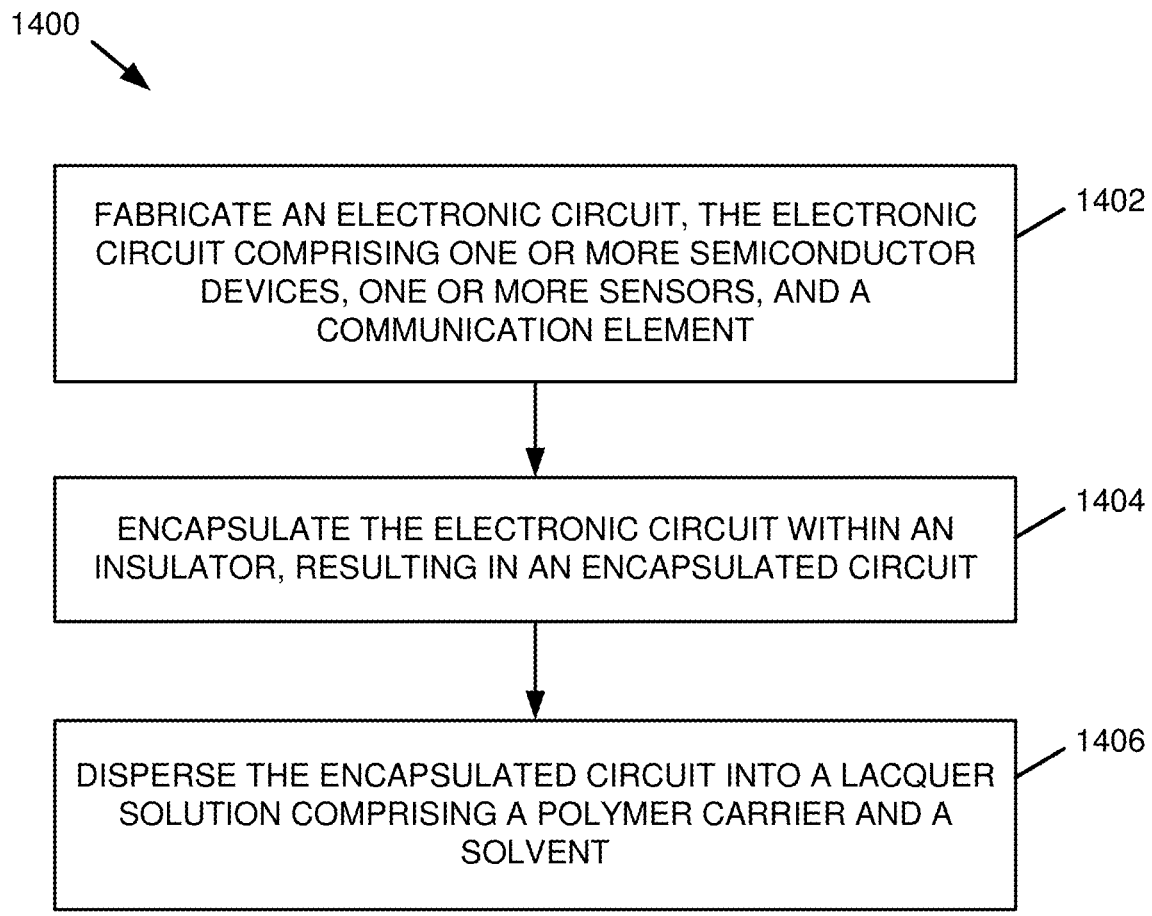
FIG. 14 is a flow diagram of an example, non-limiting method that facilitates forming and dispersing sensor devices within a polymer-based solution according to one or more embodiments described herein.

FIG. 14 illustrates a flow diagram of an example, non-limiting method 1400 that facilitates forming and dispersing sensor devices within a polymer-based solution according to one or more embodiments described herein in accordance with one or more embodiments described herein. Repetitive description of like elements employed in other embodiments described herein is omitted for sake of brevity.

At 1402, an electronic circuit, e.g., an electronic circuit 310, is fabricated. The electronic circuit can include one or more semiconductor devices, one or more sensors (e.g., sensors 312), and a communication element (e.g., communication element 314).

At 1404, the electronic circuit fabricated at 1402 is encapsulated within an insulator, resulting in an encapsulated circuit. In one example, the electronic circuit can be encapsulated at 1404 by an insulator layer 650 in the manner shown by diagram 600. Other techniques for encapsulating the electronic circuit are also possible.

At 1406, the encapsulated circuit formed at 1404 is dispersed into a lacquer solution comprising a polymer carrier and a solvent. The solvent of the lacquer solution can be and/or contain, e.g., an organic solvent or an aqueous solution, as described above with respect to FIGS. 4-10.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies can alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Moreover, because configuration of data packet(s) and/or communication between processing components and/or an assignment component is established from a combination of electrical and mechanical components and circuitry, a human is unable to replicate or perform the subject data packet configuration and/or the subject communication between processing components and/or an assignment component. For example, a human is unable to generate data for transmission over a wired network and/or a wireless network between processing components and/or an assignment component, etc. Moreover, a human is unable to packetize data that can include a sequence of bits corresponding to information generated during a spatial computing process, transmit data that can include a sequence of bits corresponding to information generated during a spatial computing process, etc.

Figure 15:
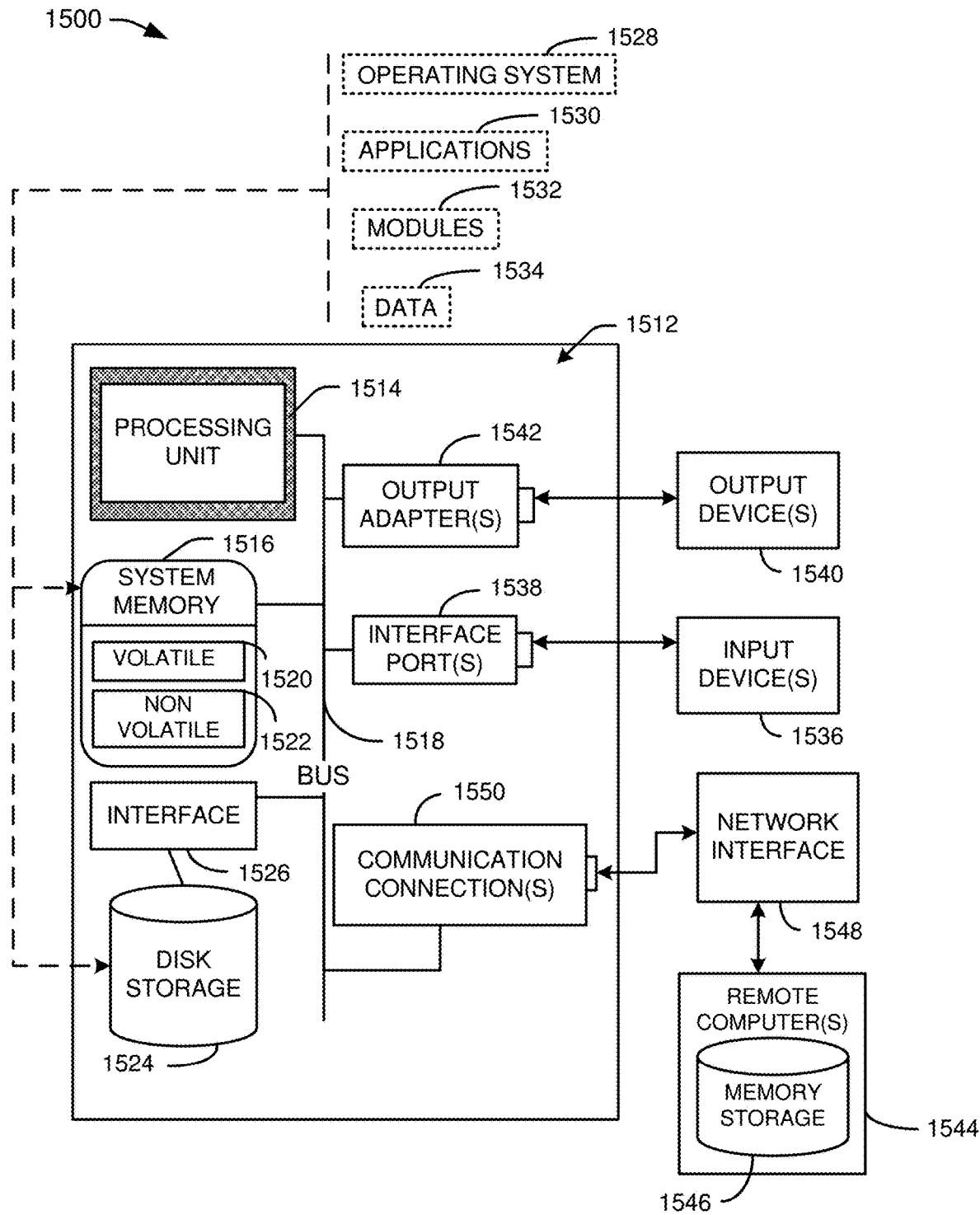
FIG. 15 illustrates a block diagram of an example, non-limiting operating environment in which one or more embodiments described herein can be implemented.

In order to provide a context for the various aspects of the disclosed subject matter, FIG. 15 as well as the following discussion are intended to provide a general description of a suitable environment in which the various aspects of the disclosed subject matter can be implemented. FIG. 15 illustrates a block diagram of an example, non-limiting operating environment in which one or more embodiments described herein can be facilitated. Repetitive description of like elements employed in other embodiments described herein is omitted for sake of brevity. With reference to FIG. 15, a suitable operating environment 1500 for implementing various aspects of this disclosure can also include a computer 1512. The computer 1512 can also include a processing unit 1514, a system memory 1516, and a system bus 1518. The system bus 1518 couples system components including, but not limited to, the system memory 1516 to the processing unit 1514. The processing unit 1514 can be any of various available processors. Dual microprocessors and other multiprocessor architectures also can be employed as the processing unit 1514. The system bus 1518 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1516 can also include volatile memory 1520 and nonvolatile memory 1522. The basic input/output system (BIOS), containing the basic routines to transfer information between elements within the computer 1512, such as during start-up, is stored in nonvolatile memory 1522. By way of illustration, and not limitation, nonvolatile memory 1522 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1520 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1512 can also include removable/non-removable, volatile/nonvolatile computer storage media. FIG. 15 illustrates, for example, a disk storage 1524. Disk storage 1524 can also include, but is not limited to, devices like a magnetic disk drive, floppy disk drive, tape drive, Jaz drive, Zip drive, LS-100 drive, flash memory card, or memory stick. The disk storage 1524 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1524 to the system bus 1518, a removable or non-removable interface is typically used, such as interface 1526. FIG. 15 also depicts software that acts as an intermediary between users and the basic computer resources described in the suitable operating environment 1500. Such software can also include, for example, an operating system 1528. Operating system 1528, which can be stored on disk storage 1524, acts to control and allocate resources of the computer 1512. System applications 1530 take advantage of the management of resources by operating system 1528 through program modules 1532 and program data 1534, e.g., stored either in system memory 1516 or on disk storage 1524. It is to be appreciated that this disclosure can be implemented with various operating systems or combinations of operating systems. A user enters commands or information into the computer 1512 through input device(s) 1536. Input devices 1536 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1514 through the system bus 1518 via interface port(s) 1538. Interface port(s) 1538 include, for example, a serial port, a parallel port, a game port, and a universal serial bus (USB). Output device(s) 1540 use some of the same type of ports as input device(s) 1536. Thus, for example, a USB port can be used to provide input to computer 1512, and to output information from computer 1512 to an output device 1540. Output adapter 1542 is provided to illustrate that there are some output devices 1540 like monitors, speakers, and printers, among other output devices 1540, which require special adapters. The output adapters 1542 include, by way of illustration and not limitation, video and sound cards that provide a means of connection between the output device 1540 and the system bus 1518. It should be noted that other devices and/or systems of devices provide both input and output capabilities such as remote computer(s) 1544.

Computer 1512 can operate in a networked environment using logical connections to one or more remote computers, such as remote computer(s) 1544. The remote computer(s) 1544 can be a computer, a server, a router, a network PC, a workstation, a microprocessor based appliance, a peer device or other common network node and the like, and typically can also include many or all of the elements described relative to computer 1512. For purposes of brevity, only a memory storage device 1546 is illustrated with remote computer(s) 1544. Remote computer(s) 1544 is logically connected to computer 1512 through a network interface 1548 and then physically connected via communication connection 1550. Network interface 1548 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1550 refers to the hardware/software employed to connect the network interface 1548 to the system bus 1518. While communication connection 1550 is shown for illustrative clarity inside computer 1512, it can also be external to computer 1512. The hardware/software for connection to the network interface 1548 can also include, for exemplary purposes only, internal and external technologies such as, modems including regular telephone grade modems, cable modems and DSL modems, ISDN adapters, and Ethernet cards.

Various embodiments of the present can be a system, a method, an apparatus and/or a computer program product at any possible technical detail level of integration. The computer program product can include a computer readable storage medium (or media) having computer readable program instructions thereon for causing a processor to carry out one or more aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of one or more embodiments of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform one or more aspects of the present invention.

One or more aspects of the present invention are described herein with reference to flowchart illustrations and/or block diagrams of methods, apparatus (systems), and computer program products according to one or more embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Various modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
fabricating an electronic circuit, the electronic circuit comprising one or more semiconductor devices, one or more sensors, and a communication element;
encapsulating the electronic circuit within an insulator, resulting in an encapsulated electronic circuit; and
dispersing the encapsulated electronic circuit into a lacquer solution comprising a polymer carrier and a solvent.

2. The method of claim 1, further comprising:
receiving a silicon on insulator substrate comprising a carrier silicon substrate, a buried insulator layer adjacent to the carrier silicon substrate, and a silicon layer adjacent to the buried insulator layer and opposite the carrier silicon substrate;
fabricating the electronic circuit from the silicon layer;
applying an insulator layer onto the electronic circuit, resulting in the encapsulated electronic circuit;
applying a handle substrate to the insulator layer;
removing the carrier silicon substrate; and
immersing the handle substrate and the encapsulated electronic circuit in a wet solution, thereby removing the handle substrate from the encapsulated electronic circuit.

3. The method of claim 1, further comprising:
coating the encapsulated electronic circuit with a monolayer of alkyl trimethoxysilane, resulting in a coated electronic circuit; and
rinsing the coated electronic circuit with an organic solvent.

4. The method of claim 3, wherein the polymer carrier of the lacquer solution comprises nitrocellulose and the solvent of the lacquer solution is from the group consisting of ethyl acetate and butyl acetate.

5. The method of claim 1, further comprising coating the encapsulated electronic circuit with polyethylene oxide end-capped with trialkoxysilane.

6. The method of claim 5, wherein the polymer carrier of the lacquer solution comprises polyvinylpyrrolidone or polyethylene oxide diacrylate dissolved in water.

7. The method of claim 1, wherein the one or more sensors comprise a plurality of sensors of respective ones of a plurality of sensor types, and the method further comprises:
receiving, by a device operatively coupled to a processor, respective measurements from the plurality of sensors via the communication element; and
classifying, by the device, the measurements according to their corresponding sensor types using a machine learning algorithm based on historical data associated with the plurality of sensor types.

8. The method of claim 7, further comprising:
providing, by the device, the respective measurements from the plurality of sensors to a cloud computing service; and
training, by the device, the machine learning algorithm using the respective measurements from the plurality of sensors.

9. The method of claim 1, further comprising:
receiving, by a device operatively coupled to a processor, measurement data from the one or more sensors via the communication element; and
classifying, by the device, the measurement data as a data type selected from the group consisting of genuine sensor data and faulty sensor data using a machine learning algorithm.

* * * * *